United States Patent [19]

Caron

[11] 4,109,164
[45] Aug. 22, 1978

[54] CIRCUITRY FOR GENERATING RAMP TYPE SIGNALS

[75] Inventor: LaVerne A. Caron, Rochester, Mich.

[73] Assignee: Chrysler Corporation, Highland Park, Mich.

[21] Appl. No.: 772,604

[22] Filed: Feb. 28, 1977

[51] Int. Cl.² .......................... H03K 4/08; H03K 3/78
[52] U.S. Cl. ..................................... 307/228; 307/216; 328/48; 328/61; 328/130; 328/181
[58] Field of Search ................... 328/48, 61, 154, 181, 328/130; 307/216, 228

[56] References Cited

U.S. PATENT DOCUMENTS

| 3,184,685 | 5/1965 | Funk et al. .............................. 328/61 |
| 3,263,174 | 7/1966 | Bjorkman et al. ................. 328/48 X |
| 3,743,951 | 7/1973 | Carroll ................................. 328/61 X |
| 3,745,475 | 7/1973 | Turner ................................ 328/48 X |
| 4,031,476 | 6/1977 | Goldberg ............................ 328/48 X |
| 4,035,661 | 7/1977 | Carlson ............................ 328/130 X |

Primary Examiner—John S. Heyman
Attorney, Agent, or Firm—Baldwin & Newtson

[57] ABSTRACT

There is disclosed circuitry for developing ramp type signals such as sawtooth waveforms, triangular waveforms, etc. The circuitry comprises an oscillator which supplies an oscillating signal to an up/down binary counter which counts occurrences of said signal. The binary output of the counter is converted into an analog signal and supplied to an output buffer stage. An offset control is associated with the output stage whereby an offset may be introduced into the output signal produced by the output stage. A strobe control is also associated with the output stage for providing selective transmission of the output signal of the stage to an output terminal in accordance with a strobe control signal applied to the output stage. The strobe control signal and the offset control signal determine the output signal waveform shape. Circuitry is also provided with the capability of greatly increasing the normal frequency of the oscillator for correspondingly reducing the time required for diagnostic testing of the circuitry.

8 Claims, 11 Drawing Figures

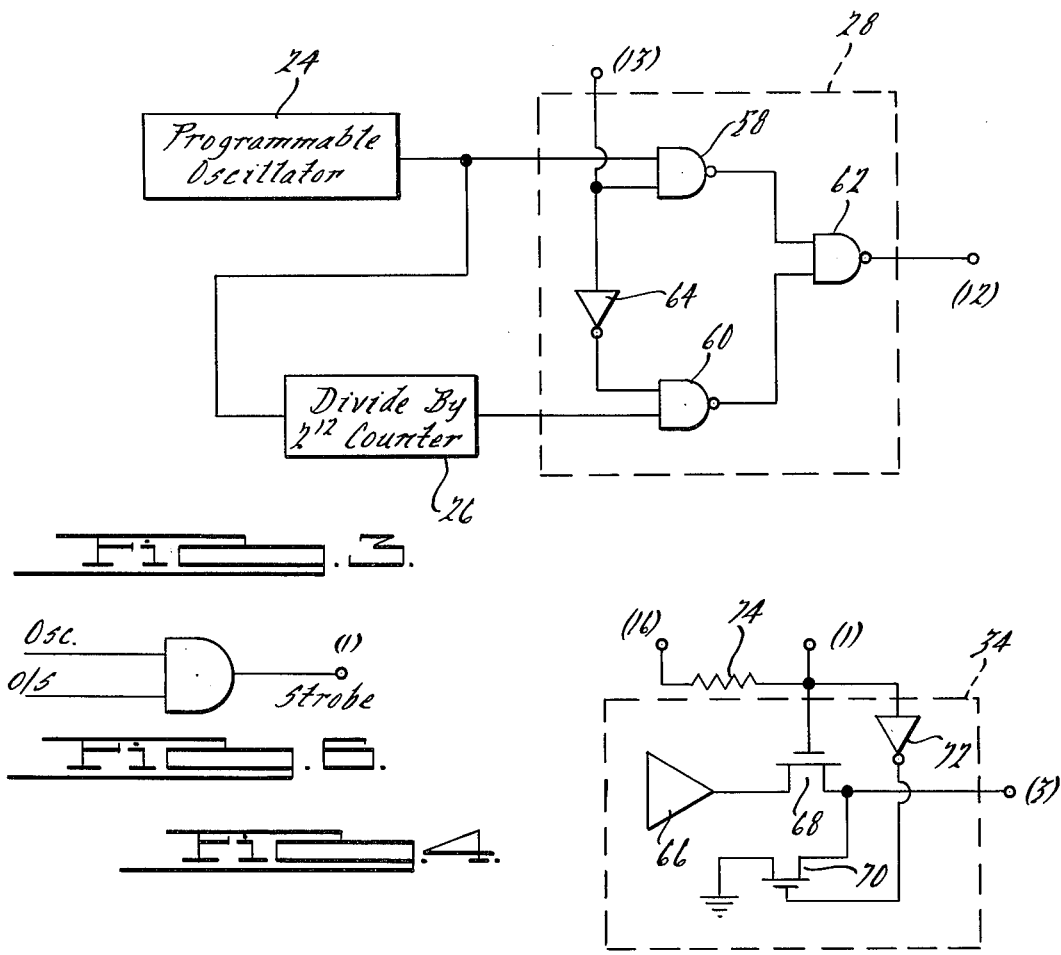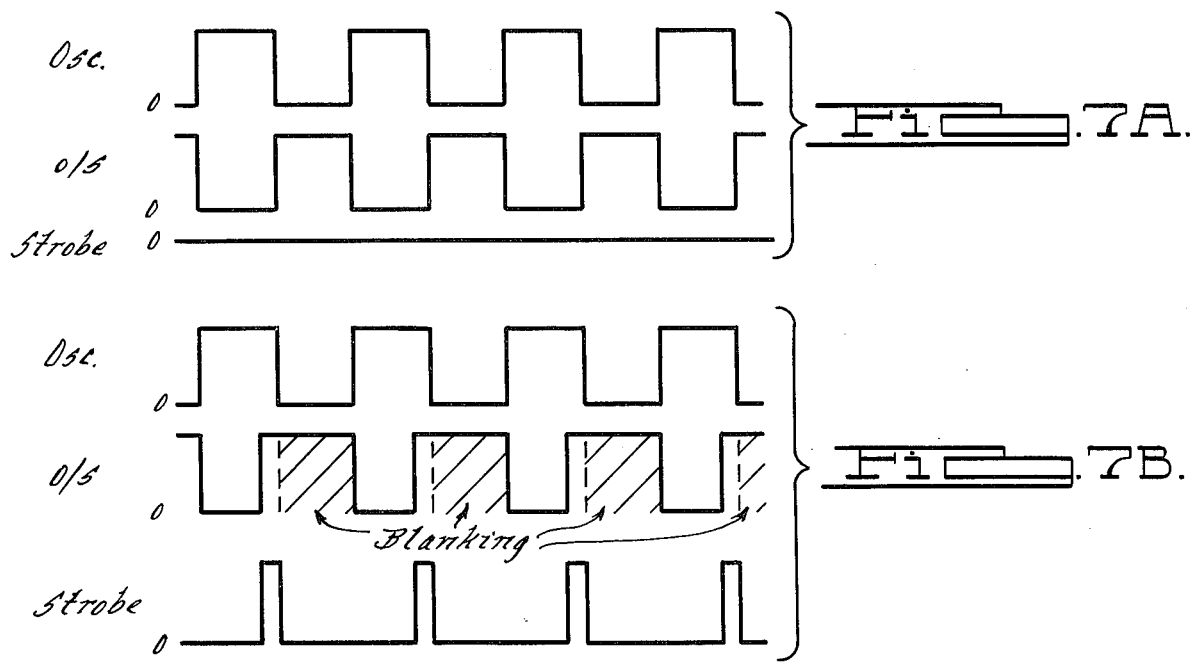

Output Of R-2R Network

Output At Terminal (3) With Offset Terminal Open

Offset Effect With Offset Control Voltage $= .2\,V_{DD}$ Above $4/9\,V_{DD}$ 4,109,164

CIRCUITRY FOR GENERATING RAMP TYPE SIGNALS

BACKGROUND AND SUMMARY OF THE INVENTION

The present invention pertains to circuitry for generating ramp type signal waveforms such as sawtooth waveforms, triangular waveforms, etc.

With circuitry according to the present invention, a variety of ramp type waveform signals can be generated which are useful in a number of applications, for example, one application being electronic engine controls for internal combustion engines. Importantly, the present invention, in one aspect, relates to improvements in circuitry of the aforementioned type which enables substantial portions of the circuitry to be fabricated utilizing existing technology in an integrated circuit device. Moreover, with such fabrication, a device embodying principles of the present invention, possesses a substantial versatility permitting use thereof in a variety of possible applications. Moreover, a variety of waveforms can be generated utilizing relatively simple control signals.

One feature of the present invention relates to the utilization, both individually and collectively, of a strobe control signal and an offset control signal for a generation of a variety of possible ramp type waveforms.

Another feature of the invention relates to means for increasing the frequency of an oscillator signal whose oscillations are counted by the binary counter from which said analog signal is generated so that diagnostic testing of the circuit can be accomplished more rapidly.

A still further feature of the invention relates to the aforesaid circuit arrangement for fabrication of portions of the circuitry as a solid state integrated circuit device.

The foregoing features advantages and benefits, along with additional ones, will be seen in the ensuing description and claims which should be considered in conjunction with the accompanying drawings.

BRIEF DESCRIPTION OF THE DRAWINGS

The drawings disclose an illustrative, but presently preferred, embodiment of the present invention according to the best mode presently contemplated in carrying out the invention.

FIG. 3 is an electrical schematic drawing illustrating another portion of FIG. 1 in greater detail.

FIG. 4 is an electrical schematic diagram illustrating a further portion of FIG. 1 in greater detail.

FIG. 6 is an electrical schematic diagram illustrating an external circuit with which the invention may be used in one possible application thereof.

FIGS. 7A and 7B illustrate various waveforms useful in explaining the operation of the circuitry of the invention in said one possible application thereof.

DESCRIPTION OF THE PREFERRED EMBODIMENT

Figure 1:
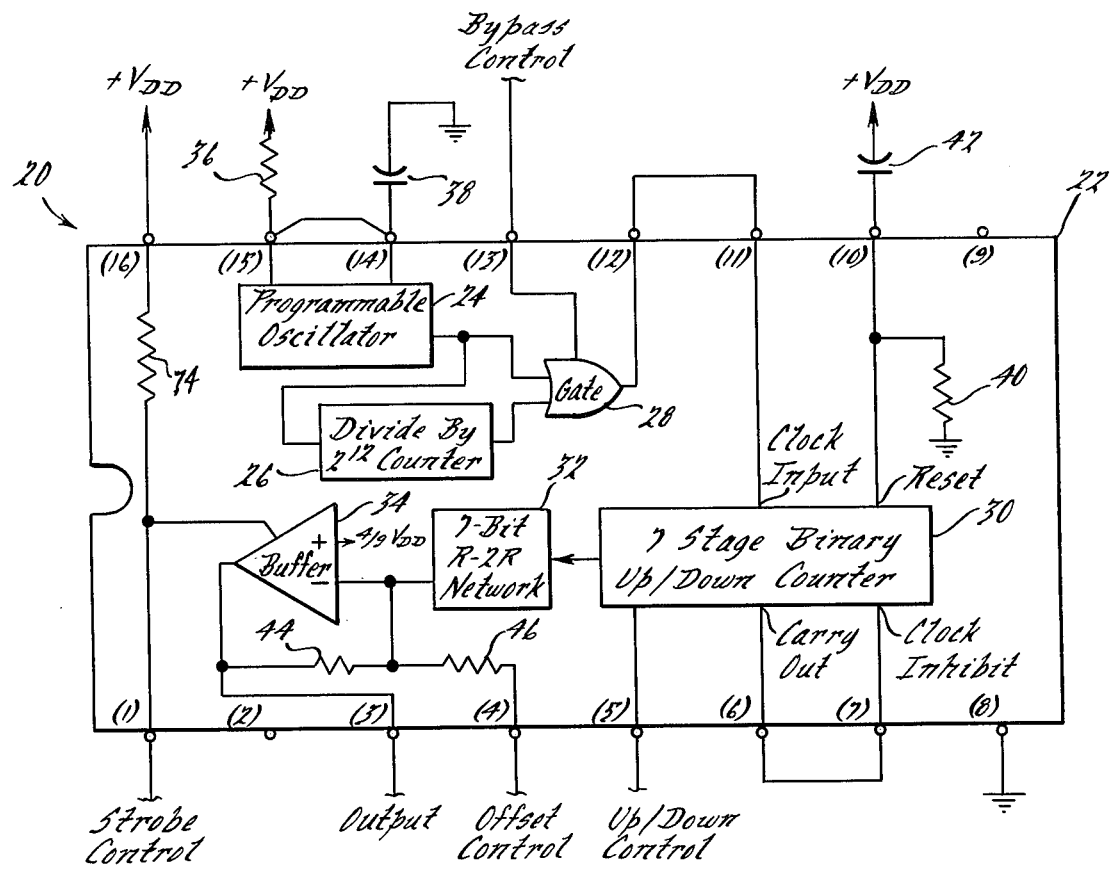
FIG. 1 is an electrical schematic diagram of circuitry embodying principles of the present invention.

FIG. 1 illustrates circuitry 20 embodying principles of the present invention and comprising an integrated circuit 22, having a plurality of terminals via which the integrated circuit may be connected in an operative system. The terminals are identified by the parenthetically enclosed numerals (1) through (16) inclusive. The terminals (8), (16), provide for connection of a source of D. C. energizing potential for energizing integrated circuit 22 from a power supply such as $+V_{DD}$ as illustrated. Circuit 22 contains a programmable oscillator stage 24, a divide by $2^{12}$ counter stage 26, and a gate 28 which form one portion of the circuitry. Also included as a second portion of circuitry on integrated circuit 22 are a seven stage binary up/down counter 30, a seven bit R-2R network 32 and an output buffer stage 34 having a resistor 44 connected between its output and its inverting input. Programmable oscillator 24 is operably associated with terminals (15), (14), which provide for connection of external circuit components which establish the oscillating frequency of the stage. Accordingly, an RC circuit comprising a resistor 36 and a capacitor 38 are connected in circuit as illustrated with terminals (15), (14). The oscillator stage produces an oscillating output signal which is supplied to one input of gate 28. The oscillating signal is also supplied to the input of counter 26 and the output of the latter is supplied as an input to the second input of gate 28. Preferably, oscillator stage 24, in cooperation with resistor 36 and capacitor 38, is configured to provide for a fairly high frequency signal, for example, a frequency of four kilohertz. Counter 26 frequency divides the oscillating signal of oscillator stage 24 to produce a much lower frequency signal, which in the example is at a frequency of $2^{-12}$ times the frequency of the oscillating signal provided by stage 24. Terminal (13) is operably associated with gate 28 and the gate output is connected to terminal (12). A bypass control signal is intended to be supplied to terminal (13) to selectively control the transmission of the oscillator signal and the frequency-divided version thereof through gate 28 to terminal (12). The bypass control signal will cause the frequency-divided version of the oscillating signal to be conducted through gate 28 to terminal (12) to the exclusion of the oscillating signal itself whenever the bypass control signal is at a logic zero signal level. Correspondingly, when the bypass control signal is at a logic one signal level, the gate transmits the actual oscillating signal to terminal (12) to the exclusion of the frequency-divided version thereof.

In the preferred utilization of circuit 20, terminal (12) directly connects to terminal (11). Terminal (11) in turn, connects with the clock input of the seven stage binary up down counter 30 so that counter 30 can count the oscillations of the signal which is supplied by gate 28. Counter stage 30 may be fabricated according to conventional techniques to provide a seven bit binary output signal which is representative of the number of oscillations counted by the counter. In order to further enhance the capabilities of device 22, certain control inputs and outputs of counter 30 are connected with selected ones of the terminals to provide for certain external control of the counter. For one, the reset input of the counter connects to terminal (10). An internal resistor 40 and an external capacitor 42, connected as illustrated, provide for coupling of a reset pulse to the counter whenever the DC power supply is activated. This insures that the count in the counter will be reset to an all ones condition when the power is turned on. An up/down control input of the counter connects to terminal (5) so that the direction in which the counter counts can be controlled by an external up/down control signal applied to terminal (5). By way of example, counter 30 will count down when the up/down control signal is at a logic one and up when the up/down control signal is at a logic zero. The carry out output of the counter connects to terminal (6) and the clock inhibit input connects to terminal (7). In the illustrated usage, terminals (6) and (7) are directly connected together by means of an external connection. By providing this connection, the counter operates in a non-overflow mode. Thus, when an all ones or all zeros state is achieved, the counter will hold this state until made to count in an opposite direction. Details of fabrication of such a seven bit binary up/down counter are known in the art and details thereof are not explained herein in the interest of brevity.

The seven bits constituting the seven bit binary output of the counter are coupled to R-2R network 32. The R-R2 network 32 converts the binary count contained in counter 30 into an analog signal whose magnitude corresponds to the actual count in the counter.

This analog signal is in turn supplied to the inverting input of output stage 34. The non-inverting input of stage 34 is connected to an appropriate fraction of the $+V_{DD\ supply}$, preferably 4/9 $V_{DD}$ as shown. Disregarding for a moment the additional control features associated with output stage 34 which will be described in detail hereinafter, the output stage produces an output signal whose magnitude corresponds to the magnitude of the analog signal received from R-2R network 32. This signal appears at terminal (3). The illustrated construction of output stage 34 is such that the output signal becomes more positive as the analog signal from R-2R network 32 becomes less positive and vice versa. This is because of the inverting characteristic of output stage 34. Thus, when counter 30 is reset to an all ones state at power up, the output signal at terminal (3) assumes a minimum magnitude. As the count in the counter progressively decreases toward an all zeros state, the output signal at terminal (3) progressively increases toward a maximum signal level.

In accordance with additional control features of the present invention, additional inputs and circuitry are associated with output stage 34. These include: a strobe input connected with terminal (1) at which a strobe control signal is applied; and an offset input connected with terminal (4) at which an offset control signal is applied. Briefly, the application of an offset control signal to terminal (4) causes the output signal produced by stage 34 to be offset in voltage from that which would otherwise be produced were the offset control feature not provided. The amount of the offset is a function of the magnitude of the offset control signal, as will be explained more fully hereinafter. The strobe control signal provides for selective transmission of the output signal to terminal (3) in accordance with the strobe control signal applied to terminal (1). The capability afforded by the utilization of strobe control and offset control provides for the extensive capability of the circuit as will be explained more fully hereinafter. Having therefore briefly described the basic elements of FIG. 1., attention can now be directed to more specific details which are shown in FIGS. 2 through 4.

Figure 2:
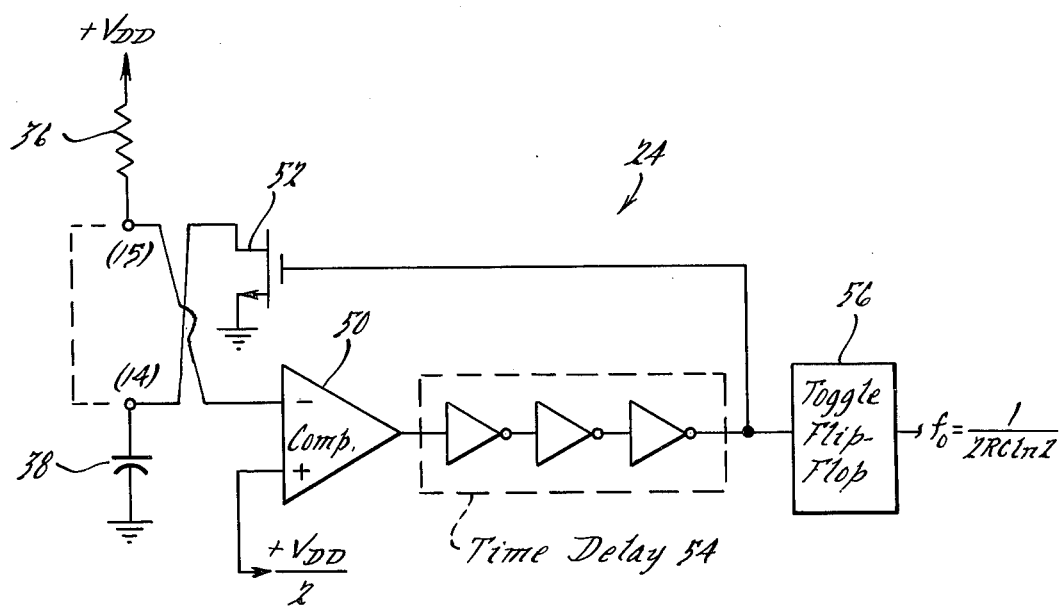
FIG. 2 is an electrical schematic diagram illustrating a portion of FIG. 1 in greater detail.

In FIG. 2, a possible implementation for programmable oscillator 24 is illustrated. In this implementation, the resistor 36 and capacitor 38 are serially connected across the DC potential with the junction of the two being connected to the inverting input of a comparator 50 and to the source terminal of a field effect transistor (FET) 52. The non-inverting input of comparator 50 is connected to one half of the DC supply voltage. The drain terminal of FET 52 connects to ground, and the gate connects to the output of a time delay circuit 54 whose input is connected to the output of comparator 50. The output of time delay circuit 54 also connects to a toggle flip-flop 56. This implementation operates in the following manner. Capacitor 38 tends to charge toward $+V_{DD}$ through resistor 36 with a charging rate being determined by the time constant of resistor 36 and capacitor 38. However, transistor 52 discharges capacitor 38 before it can be fully charged and thus, a repeated oscillation is sustained. Comparator 50 monitors the voltage across capacitor 38 and when the voltage exceeds the reference $+V_{DD}/2$, transistor 52 switches into conduction to discharge the capacitor. Once the capacitor discharges, comparator 50 switches back to its original condition causing conduction of transistor 52 to terminate. Delay circuit 54 serves to maintain transistor 52 in conduction for an interval just long enough to ensure discharge of capacitor 38. The toggle flip-flop 56 develops in turn, a square wave oscillation having a 50% duty cycle. It is this square wave which represents the output signal of oscillator stage 24. The frequency, $f_o$, of the square waveform output of flip-flop 56 is given by the formula $$f_o = 1/2\ RC\ ln2$$

where $R$ is the resistance of resistor 36 and $C$ is the capacitance of capacitor 38.

In FIG. 3, a possible implementation for gate 28 is shown. Gate 28 comprises a plurality of three NAND gates 58, 60, 62 and an inverter 64 connected as illustrated. The oscillating signal from oscillator 24 is supplied to one input of gate 58 while the frequency-divided version thereof is supplied to one input of gate 60. Terminal (13) directly connects to the other input of gate 58 and through inverter 64 to the other input of gate 60. In this way the signal applied to terminal (13) selectively controls the transmission of the oscillator signal and frequency-divided version thereof through the gate 28 to terminal (12).

FIG. 4 illustrates a possible implementation for output stage 34. The implementation includes a conventional comparator 66, a pair of transmission gates 68 and 70 respectively, and an inverter 72. These components are connected as illustrated. Terminal (1) is connected via an internal pull-up resistor 74 with the positive polarity terminal $+V_{DD}$. The strobe control signal at terminal (1) selectively controls transmission gates 68 and 70 such that when the strobe control signal is high, the output signal at the output of comparator 66 is transmitted through gate 68 to terminal (3) while when the strobe control signal is low the transmission gate 70 is caused to transmit the ground signal through to terminal (3).

Figure 5:
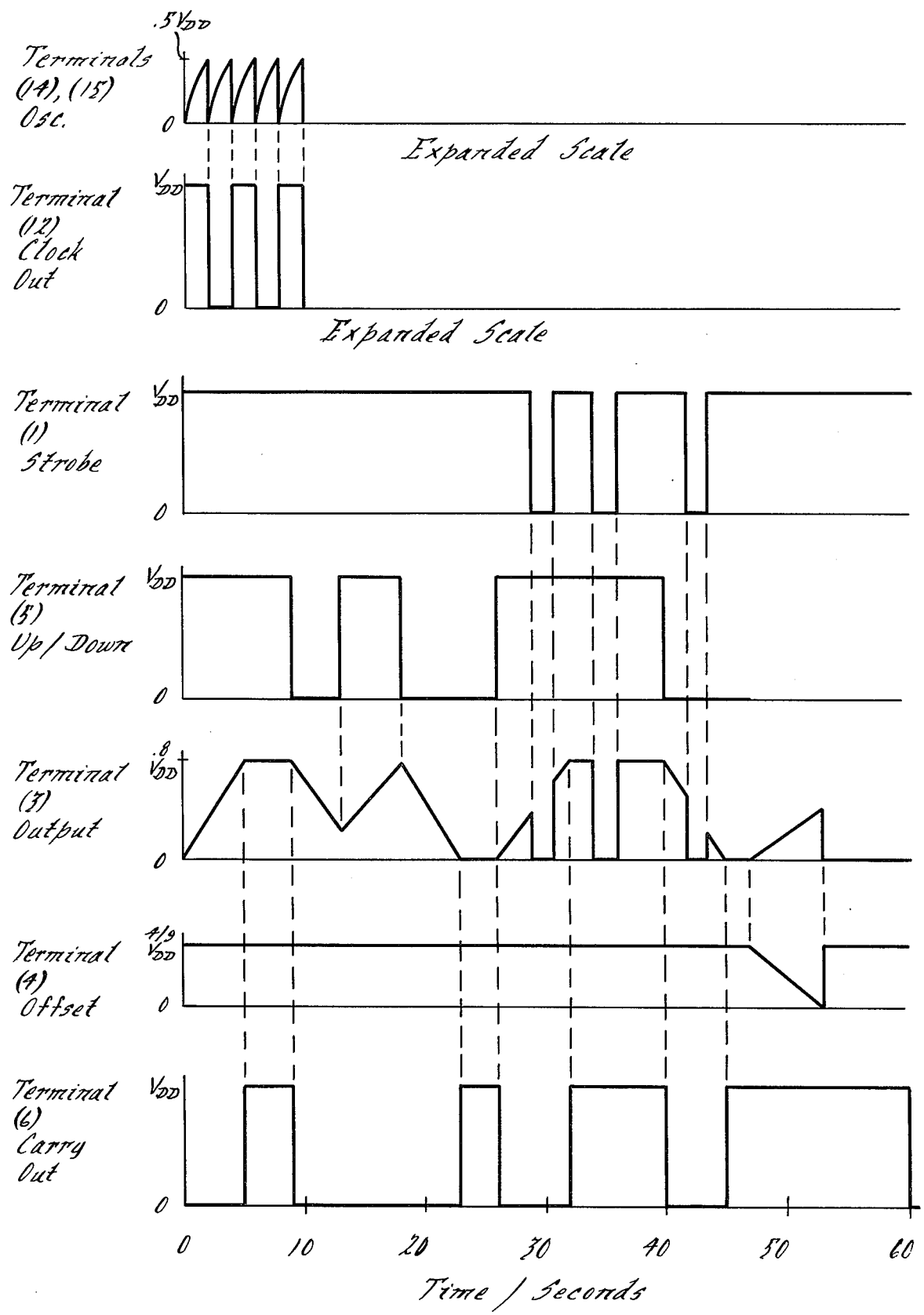
FIG. 5 is a diagram of illustrative waveforms useful in understanding operation of the circuitry of FIG. 1.

FIG. 5 is a timing diagram illustrating the control signals. The terminal (3) signal waveform illustrates how various ramp type signals can be generated by utilizing the various control input signals such as the strobe control, offset control, and up/down control signals. In view of the foregoing description of FIG. 1, the waveforms of FIG. 5 are believed self-explanatory and will not be explained in greater detail.

A possible usage of the present invention is described with reference also to FIGS. 6 and 7. In this usage a two input AND gate (FIG. 6) receives an oscillator waveform (OSC) at one input and a one-shot waveform (O/S) at the other input. The AND gate output is connected to terminal (1), the strobe control signal being provided by the output signal of the AND gate. By adjusting the phase and frequency of the OSC signal relative to a 50% nominal duty cycle of the O/S signal, both signals are made to cancel each other so that the strobe signal is forced to ground. Such a condition is shown in FIG. 7A. Now, as a parameter of the one-shot circuit (inductance, for example) is caused to vary, the duty cycle of the O/S signal similarly varies. This produces a pulse waveform strobe signal, as shown by FIG. 7B. By making the 50% duty cycle of the O/S signal representative of the zero value of a second parameter (such as engine vacuum in an internal combustion engine) which controls the first-mentioned parameter of the one-shot circuit, the area of each strobe pulse is made directly proportional to the second parameter. By strobing the output buffer stage with such a strobe signal, the area of each output pulse appearing at terminal (3) is directly proportional to the product of the analog signal received from R-2R network 32 and said second parameter, the analog signal representing time. This usage considerably simplifies engine control circuitry of the type shown in U.S. Pat. No. 3,978,833.

Figure 8A:
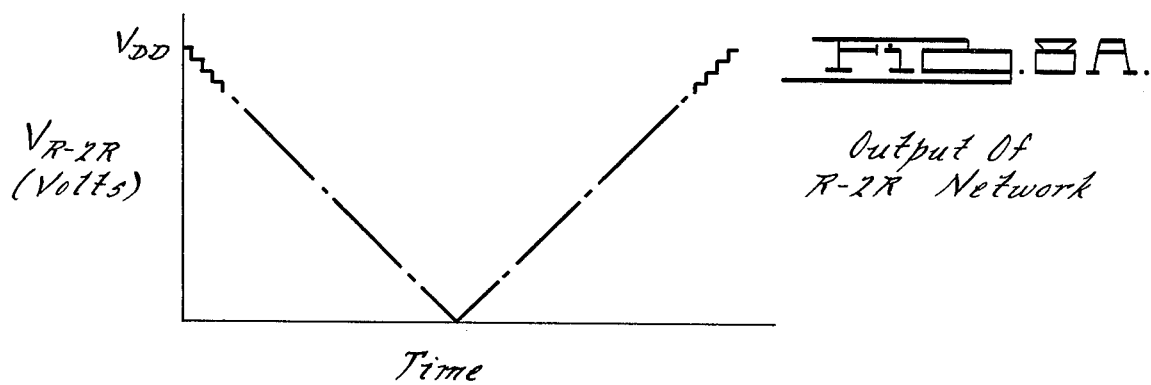
FIGS. 8A, 8B, and 8C illustrate additional explanatory waveforms.
Figure 8B:
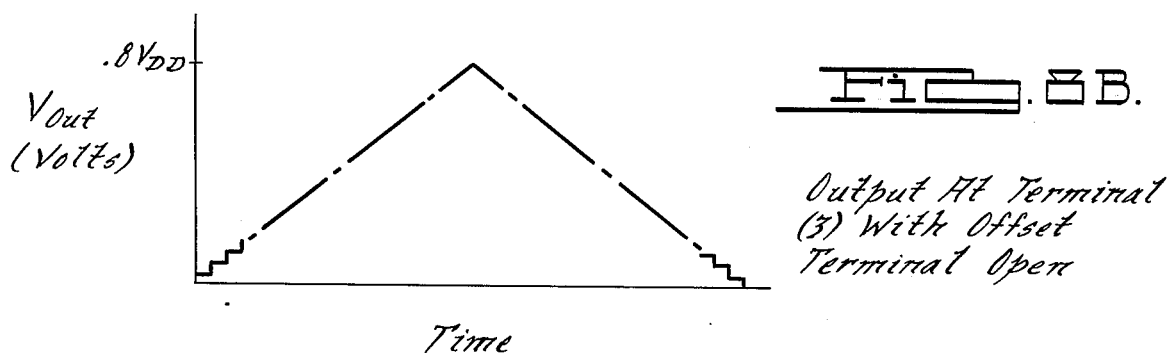
Figure 8C:
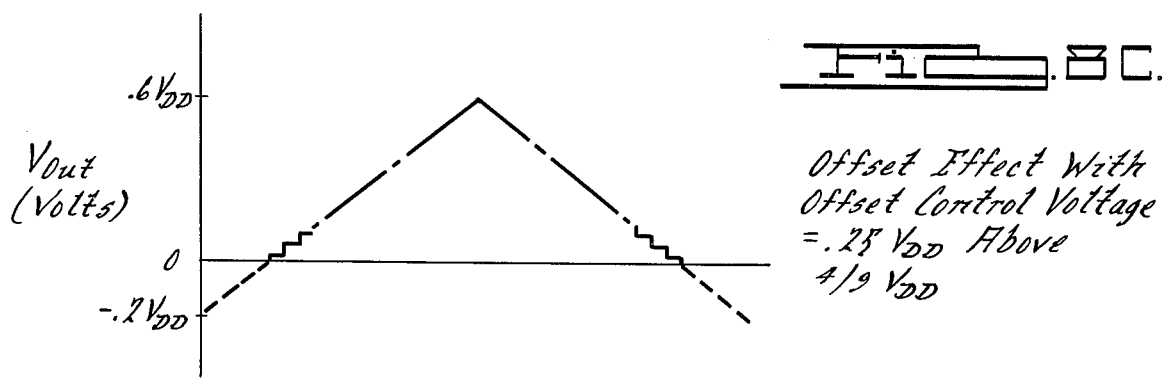

FIGS. 8A, 8B, and 8C illustrate graphically how the offset control feature works. The magnitude of the offset control signal determines the amount by which the FIG. 8B waveform is offset. Because the output of the buffer 66 cannot be pulled down below ground, the range of the terminal (3) $V_{out}$ signal becomes more limited as the offset control signal becomes more positive. With such offset control, it bcomes necessary for the count in counter 30 to exceed a predetermined number (determined by the magnitude of the offset control signal) before strobed output pulses begin to appear at terminal (3), as described in the above exemplary usage of FIGS. 6 and 7. This is of advantage in developing the accumulation function signal referred to in said U.S. Pat. No. 3,978,833. In the illustrated embodiment, the output resistance of the R-2R network and the resistance of the resistor 46 which couples the offset control signal to the stage are equal. The resistor 44 has a resistance equal to 80% of that of resistor 46. It will be noted that the buffer provides an attenuation factor 0.8.

Other advantages of the circuit are that the by-pass control signal can be utilized to greatly increase the frequency of operation of the system for a diagnostic test purpose. Also, the provision for connection of external devices to program portions of the circuit (such as the oscillator for example) to permit usage in a variety of applications.

From the foregoing it can be seen that the present invention provides improvements in circuitry for generating ramp type signals which offer considerable simplification and versatility.

What is claimed is:
1. A circuit comprising:
   an input terminal for receiving a repetitive input signal;
   an output terminal;
   means including a counter circuit coupled to said input terminal for registering in its count occurrences of said input signal and providing an analog signal whose magnitude is representative of its count;
   an output buffer stage receiving said analog signal and providing a corresponding output signal, and control circuitry coupled with said output stage, said control circuitry comprising,
   offset control means for offsetting the output signal of said buffer stage in accordance with an offset control signal,
   and, strobe control means providing for selective transmission of the output signal of said buffer stage to said output terminal in accordance with a strobe control signal.

2. A circuit as set forth in claim 1 wherein said counter circuit comprises a multi-bit binary counter.

3. A circuit as set forth in claim 2 wherein said first-mentioned means includes an R-2R network coupled with said multi-bit binary counter to provide said analog signal.

4. A circuit as set forth in claim 1 wherein said offset control means comprises means providing for coupling of the offset control signal to an input of said output buffer stage, another input of said output buffer stage being coupled to receive said analog signal.

5. A circuit as set forth in claim 4 wherein said strobe control means comprises transmission gate means coupling the output of said output buffer stage with said output terminal, said transmission gate means having control means therefor to which the strobe control signal is adapted to be applied.

6. A circuit as set forth in claim 1 wherein said first-mentioned means comprises means for selectively controlling the direction in which said counter circuit registers occurrences of said input signal.

7. A circuit as set forth in claim 6 wherein said first-mentioned means comprises means for limiting the count in said counter circuit in both directions.

8. An electronic circuit device adapted for fabrication as a solid state microcircuit device comprising:
   14 terminals via which the device may be connected in an operative system;
   the first and second of said fourteen terminals providing for connection of the device with a DC source of energizing potential for energizing the device;
   an oscillator stage having the third and fourth of said 14 terminals connected therewith, said third and fourth terminals providing for connection of external circuitry to endow the oscillator stage with a desired characteristic, said oscillator stage having an output for giving an oscillating signal;
   a frequency divider stage having an input connected with the output of said oscillator stage, and having an output for giving a frequency-divided version of said oscillating signal;
   a gate circuit having a control input connected with the fifth of said 14 terminals and having another input connected with the output of said oscillator stage and having still another input connected with the output of said frequency divider stage, said gate circuit having an output connected with the sixth of said 14 terminals and comprising means for selectively transmitting one of said oscillating signal and frequency-divided version thereof to the exclusion of the other of said sixth terminal in accordance with a control signal applied to said fifth terminal;

a multi-bit binary up/down counter stage having a reset input connected with the seventh of said 14 terminals for resetting the counter stage by a reset signal applied to said seventh terminal, an up/down control input connected with the eighth of said 14 terminals for controlling the direction in which the counter stage counts by an up/down control signal applied to said eighth terminal, a carry out output connected with the ninth of said fourteen terminals at which a carry out signal is given when the counter is full and empty, a clock inhibit input connected with the tenth of said fourteen terminals for receiving a clock inhibit signal to inhibit counting by the counter, a clock input connected with the eleventh of said 14 terminals, and an output providing a multi-bit binary number representing the count in said counter stage;

an R-2R stage connected with the output of said counter stage for converting the binary number output of said counter stage into an analog signal;

an output stage having an input connected to said R-2R stage for receiving the analog signal output of said R-2R stage, an offset control input connected with the 12th of said 14 terminals, a strobe control input connected with the thirteenth of said 14 terminals, and an output connected with the 14th of said 14 terminals and at which a controlled output signal is given, said output stage comprising an output buffer receiving said analog signal and providing a corresponding buffer output signal and control means associated with said output buffer comprising means providing for offsetting of said buffer output signal in accordance with an offset control signal applied to said 12th terminal, strobe control means providing for selective transmission of said buffer output signal to said 14th terminal in accordance with a strobe control signal applied to said 13th terminal whereby said controlled output signal is controlled by both the strobe control and the offset control signals, as well as being a function of said analog signal.

* * * * *